(12) United States Patent
Boos

(10) Patent No.: US 11,411,595 B2
(45) Date of Patent: Aug. 9, 2022

(54) RANGE EXTENSION FOR INTERFERENCE CANCELLATION ANALOG TO DIGITAL CONVERTER

(71) Applicant: Intel IP Corporation, Santa Clara, CA (US)

(72) Inventor: Zdravko Boos, Munich (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/955,073

(22) PCT Filed: Mar. 28, 2018

(86) PCT No.: PCT/US2018/024789
§ 371 (c)(1),
(2) Date: Jun. 18, 2020

(87) PCT Pub. No.: WO2019/190497
PCT Pub. Date: Oct. 3, 2019

(65) Prior Publication Data
US 2021/0006279 A1    Jan. 7, 2021

(51) Int. Cl.
*H04B 1/40* (2015.01)
*H04B 1/04* (2006.01)
*H03M 1/08* (2006.01)

(52) U.S. Cl.
CPC ............ *H04B 1/40* (2013.01); *H03M 1/08* (2013.01); *H04B 1/0475* (2013.01)

(58) Field of Classification Search
CPC ...... H04B 1/04; H04B 1/0475; H04B 1/0028; H04B 1/0032; H04B 1/0039; H04B 1/10;
(Continued)

(56) References Cited

U.S. PATENT DOCUMENTS 7,869,527 B2 * 1/2011 Vetter .................. H04B 1/525
375/259
10,243,719 B2 * 3/2019 Bharadia ............. H04B 1/525
(Continued)

FOREIGN PATENT DOCUMENTS

EP      2822189 A1    1/2015
EP      2999180 A1    3/2016
WO   2017139347 A1    8/2017

OTHER PUBLICATIONS

International Search Report issued for the corresponding PCT application No. PCT/US2018/024789, dated Dec. 19, 2018, 13 pages (for informational purpose only).
(Continued)

*Primary Examiner* — Quochien B Vuong
(74) *Attorney, Agent, or Firm* — Viering, Jentschura & Partner MBB

(57) ABSTRACT

Systems, methods, and circuitries are provided for extending the range of an analog-to-digital converter (ADC) associated with interference cancellation. In one example a transceiver includes front end circuitry configured to transmit a radio frequency (RF) transmit signal that includes an intended signal and an interference signal. The transceiver includes self-interference cancellation (SIC) circuitry configured to control the front end circuitry based at least on a digital baseband reference transmit signal that comprises a digital representation of the intended signal. ADC range extension circuitry is provided to: receive the RF transmit signal from the front end circuitry; receive the digital baseband reference transmit signal from the SIC circuitry; approximate the interference signal by generating an analog estimated interference signal that corresponds to a difference between the
(Continued)

RF transmit signal and the digital baseband reference transmit signal; and provide the analog estimated interference signal to the ADC.

15 Claims, 7 Drawing Sheets

(58) Field of Classification Search
CPC . H04B 1/12; H04B 1/123; H04B 1/40; H04B 1/44; H04B 1/48; H04B 1/56; H04B 1/525; H04B 7/0413; H04B 15/00; H04B 1/7107; H04B 7/0417; H03M 1/00; H03M 1/08; H03M 1/12; H03M 1/66
See application file for complete search history.

(56) References Cited

U.S. PATENT DOCUMENTS

| | | | |
|---|---|---|---|
| 10,257,746 B2* | 4/2019 | Jain | H04B 1/525 |
| 10,797,739 B1* | 10/2020 | Maleki | H04B 1/12 |

OTHER PUBLICATIONS

International Preliminary Report on Patentability for the corresponding International Application No. PCT/US2018/024789, dated Sep. 29, 2020, 8 pages (for informational purposes only).

* cited by examiner

RANGE EXTENSION FOR INTERFERENCE CANCELLATION ANALOG TO DIGITAL CONVERTER

CROSS-REFERENCE TO RELATED APPLICATIONS

This application is a national stage entry, according to 35 U.S.C. § 371, of PCT Application No. PCT/US2018/024789 filed on Mar. 28, 2018, which is herein incorporated by reference in its entirety.

BACKGROUND

Modern transceivers simultaneously transmit and receive signals across many frequency bands. Crosstalk, or interference in the received signal from the transmitted signal, can degrade the performance of transceivers. Many techniques have been applied to address the interference problems presented by multiple radio access technique (RAT) transceivers, which communicate simultaneously on several different channels.

DESCRIPTION

Figure 1:
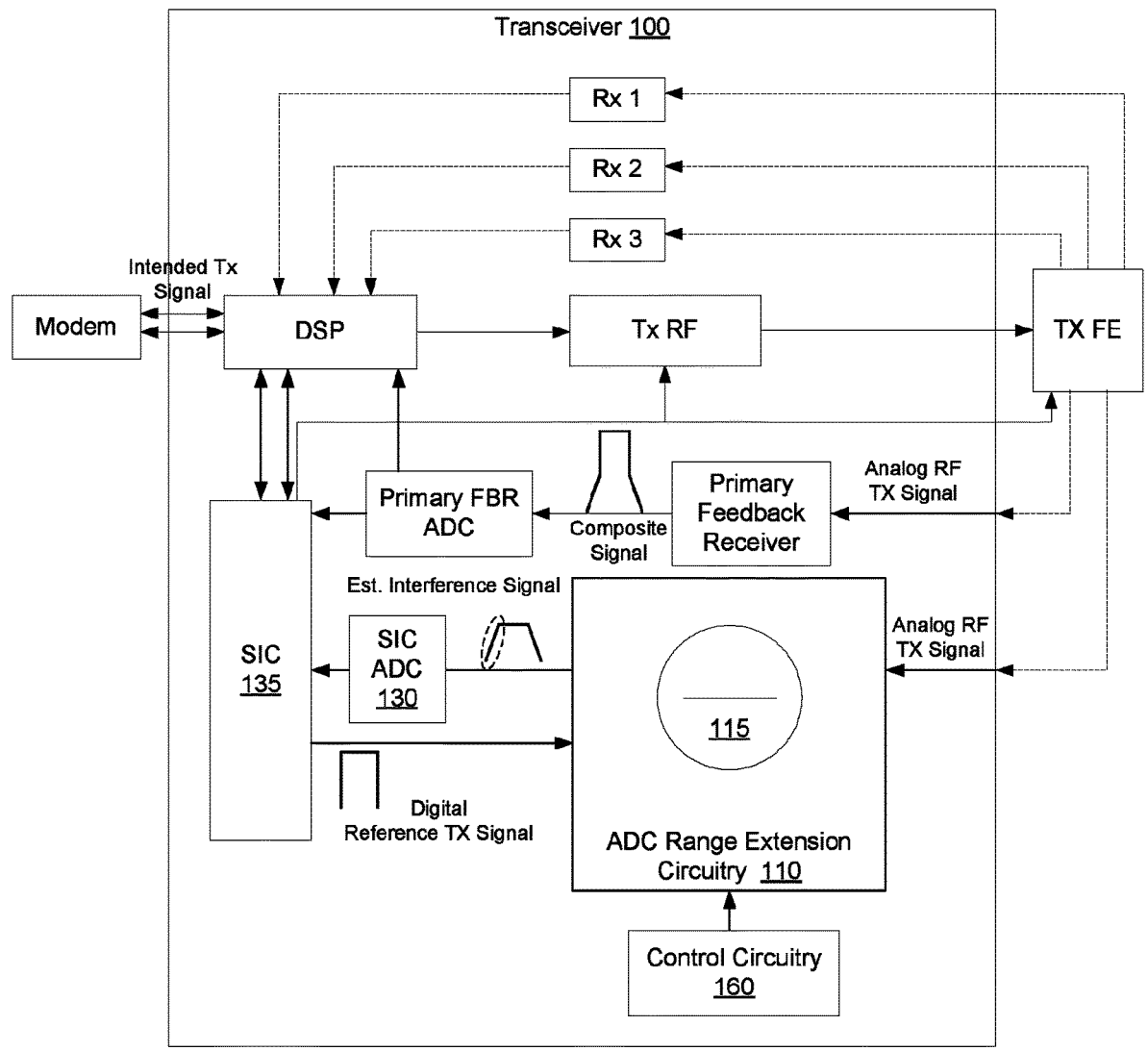
FIG. 1 illustrates an exemplary transceiver that includes an example range extension circuitry in accordance with various aspects described.

In duplex mode and in multiple RAT transceivers, due to simultaneous and concurrent transmission and reception in different frequency bands, the transmitted signal often reduces the quality of the received signal due to various imperfections in the signal chain or crosstalk. In some cases, transmit interference in the receive band can be solved with very high quality (also expensive) radio frequency (RF) filters. However, when two RATs have an RF band allocation adjacent to one another even the best RF filter may not sufficiently mitigate the interference. Furthermore, in carrier aggregation mode, receiver desense due to transmit adjacent channel leakage ratio (ACLR) can be only partially mitigated with a higher transmitter linearity, which in turn results in increased power consumption.

The quality of reception can be improved by applying so called self-interference cancellation (SIC). In SIC, in the digital domain a reference signal that approximates the intended transmit signal is subtracted from the overall or composite transmitted signal (including interference from other chains, self-interference, and so on) fed back from the front end. This subtraction aims to isolate and estimate the interference in the signal. The SIC circuitry adjusts the operation of the transceiver in various ways to compensate for this estimated interference signal. For the purposes of this description, the term "interference signal" will be used as a shorthand notation for all types of interference including ACLR noise, transmit noise in the receive band, interference from sources within the transceiver, interference from external sources, and so on.

Because the SIC circuitry performs the subtraction in the digital domain while the composite signal is an analog signal, an ADC is used to convert the composite transmitted signal (hereinafter "composite signal") to a digital signal for processing by the SIC circuitry. This conversion of the analog composite signal to a digital signal typically requires an ADC with a high dynamic range.

Described herein are interface systems, methods, and circuitries that allow a lower dynamic range ADC to be used for SIC. The disclosed ADC range extension systems, methods, and circuitries subtract the reference signal from the composite signal in the analog domain and provide the resulting analog estimated interference signal to the ADC used for SIC. Thus, rather than converting the entire composite signal to a digital signal, the ADC is tasked with converting just the portion of the composite signal that is the estimated interference signal, requiring much less dynamic range. In one example, the dynamic range of the ADC can be reduced by as much as 30 to 40 dB.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the aspects of the present disclosure. However, it will be apparent to one skilled in the art that aspects of the present disclosure may be practiced without these specific details. In other instances, well-known structures and devices are shown in block diagram form rather than in detail in order to avoid obscuring aspects of the present disclosure. In addition, features of the different aspects described hereinafter may be combined with each other, unless specifically noted otherwise.

FIG. 1 illustrates an exemplary full duplex multi-RAT transceiver 100 that includes three receiver chains and a transmit chain. Digital signal processing (DSP) circuitry is configured to process a digital intended transmit signal (also referred to as a "predetermined signal") received from a modem. The DSP circuitry performs various operations on the intended transmit signal, including predistortion of the intended transmit signal to compensate for expected interference or distortion based on characteristics of the intended transmit signal. Transmit RF circuitry converts the signal output by the DSP circuitry into an RF transmit signal in a selected frequency band. The RF transmit signal is provided to a front end module (FE) for transmission by an antenna (not shown). While a single transmit chain is illustrated in FIG. 1 for simplicity sake, it is likely that several transmit chains would be present in the transceiver 100.

The transceiver 100 includes SIC circuitry 135 that controls the DSP circuitry, the transmit RF circuitry, and also the front end based on a "reference transmit signal" and estimated interference. The reference transmit signal is received from the DSP and corresponds to or describes the intended transmit signal. The estimated interference includes self-interference, ACLR, and so on that is predicted to occur during transmission of the intended transmit signal. The transceiver 100 includes at least two feedback loops that provide input to the SIC circuitry. A primary feedback loop includes a primary feedback receiver (FBR) that downconverts the RF transmit signal to a composite signal in a baseband frequency and a primary FBR ADC that converts the composite signal to a digital composite signal. The SIC circuitry 135 utilizes the digital composite signal for several purposes including delay estimation and to close the gain control loop. The primary FBR ADC may have relatively high dynamic range because the FBR ADC converts the entire composite signal.

Much of the composite signal is contained in the transmit (central) band while a smaller portion of the signal (which includes much of the interference) is made up of out of band components. One problem with the digital composite signal as generated by the FBR ADC is that it may not provide sufficient resolution in the out of band frequencies for the purposes of interference cancellation. This is especially true when there are significant amounts of interference in out of band frequencies, which may occur in certain combinations of transmit and receive frequencies or during operation of certain RATs, such as WiFi and WiGig, or due to carrier aggregation. However, during normal duplex operation, when out of band interference will be minimal, the composite signal may provide sufficient resolution in the out of band frequencies for the SIC circuitry 135 to effectively compensate for interference.

A second feedback loop includes ADC range extension circuitry 110 that includes subtraction circuitry 115 that receives a digital reference signal from the SIC circuitry 135 and the analog RF transmit signal from the front end. The subtraction circuitry 115 subtracts or determines the difference between the digital reference transmit signal and the analog RF transmit signal to generate an analog estimated interference signal. The subtraction circuitry may be an addition circuit that achieves subtraction by inverting one of the signals, e.g. the baseband reference transmit signal before of the addition. The subtraction circuitry may include a suitable resistor network, which may consist of ordinary resistors but also complex resistors or impedances, i.e. combinations of inductors capacitors and resistors, that combines the two signals. The subtraction circuity may also include transistors or operational amplifiers (OPAMPs) where the signals are fed into different ports of an OPAMP.

The analog estimated interference signal thus corresponds to a difference between the analog RF transmit signal and the digital reference signal. The estimated interference signal is provided to a SIC ADC 130 that converts the analog estimated interference signal to a digital estimated interference signal for use by the SIC circuitry 135 in cancelling noise and interference. Because the portion of the analog RF transmit signal corresponding to the intended transmit signal (i.e., the digital reference transmit signal) has been removed from the estimated interference signal, the SIC ADC 130 may have lower dynamic range (e.g., a less expensive ADC). Further, the resolution of the estimated interference signal in the out-of-band frequencies that contain interference (circled in dashed line in FIG. 1) may be improved, which in turn improves the performance of the SIC circuitry.

Control circuitry 160 controls the ADC range extension circuitry 110 to enable the ADC range extension circuitry 110 when an activation criterion is met. For example, the control circuitry 160 may send an activation signal to enable the ADC range extension circuitry 110 when carrier aggregation is in use or when certain combinations of transmit frequency and receive frequency (e.g., harmonics) are in simultaneous use by the transceiver. Control circuitry 160 controls the ADC range extension circuitry 110 by sending a deactivation signal (or ceasing to send the activation signal) to disable the ADC range extension circuitry 110 when the activation criterion is not met. For example, when it is expected that the out of band interference signal components will not be strong, or if the transceiver is operating in normal duplex mode, the ADC range extension circuitry 110 may be disabled by the control circuitry 160 and the SIC circuitry 135 may receive input from only the FBR ADC and not the SIC ADC 130.

Figure 2:
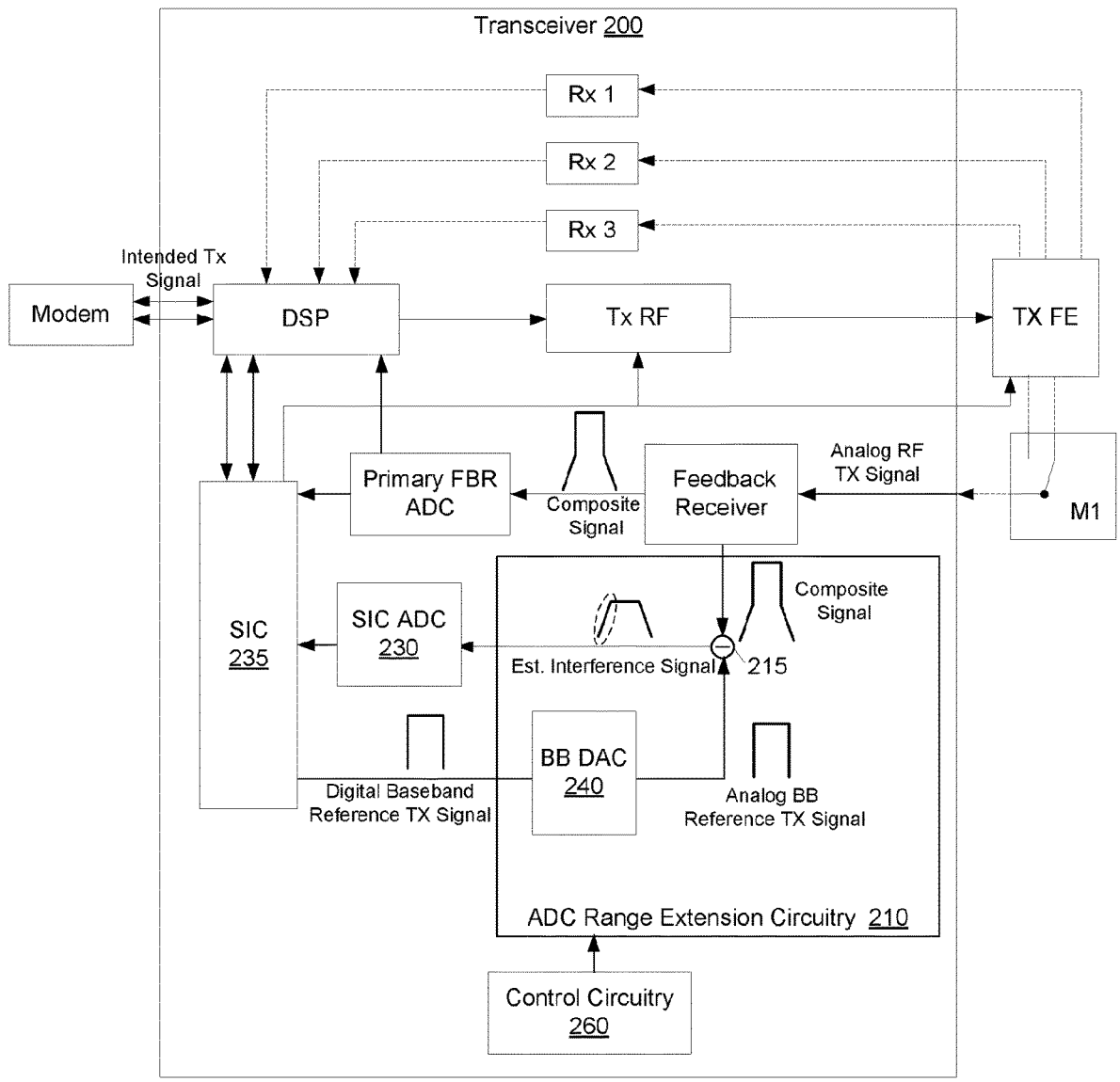
FIG. 2 illustrates an exemplary transceiver that includes an example range extension circuitry in accordance with various aspects described.

FIG. 2 illustrates an exemplary transceiver 200 that includes one example ADC range extension circuitry 210. The transceiver 200 includes many of the same components described with reference to FIG. 1 which will not be reintroduced for brevity sake, including a modem, DSP circuitry, transmit RF circuitry, front end, and receiver chains. Control circuitry 260 is configured to selectively activate/enable and deactivate/disable the ADC range extension circuitry 210 as just discussed. The transceiver 200 includes a multiplexer M1 which selects a point in the front end from which the RF transmit signal is fed back. The use of the multiplexer allows the feedback signal to be selected from amongst different transmit chains. The multiplexer may also allow the feedback signal to be selected before or after components of interest in the transmit chain, such as filters or diplexers, that may be related to noise being measured or that are specifically used to condition the feedback signal.

The ADC range extension circuitry 210 receives the composite signal, which is the RF transmit signal downconverted to the baseband frequency, from the feedback receiver in the primary feedback loop. The ADC range extension circuitry 210 includes a baseband digital-to-analog converter (DAC) 240 that converts the digital baseband reference transmit signal from SIC circuitry to an analog baseband reference transmit signal. Subtraction circuitry 215 computes a difference between the composite signal and the analog baseband reference transmit signal to generate the estimated interference signal. The estimated interference signal is provided to a SIC ADC 230, which generates a digital estimated interference signal for use by SIC circuitry 235 in noise or interference cancellation.

Figure 3:
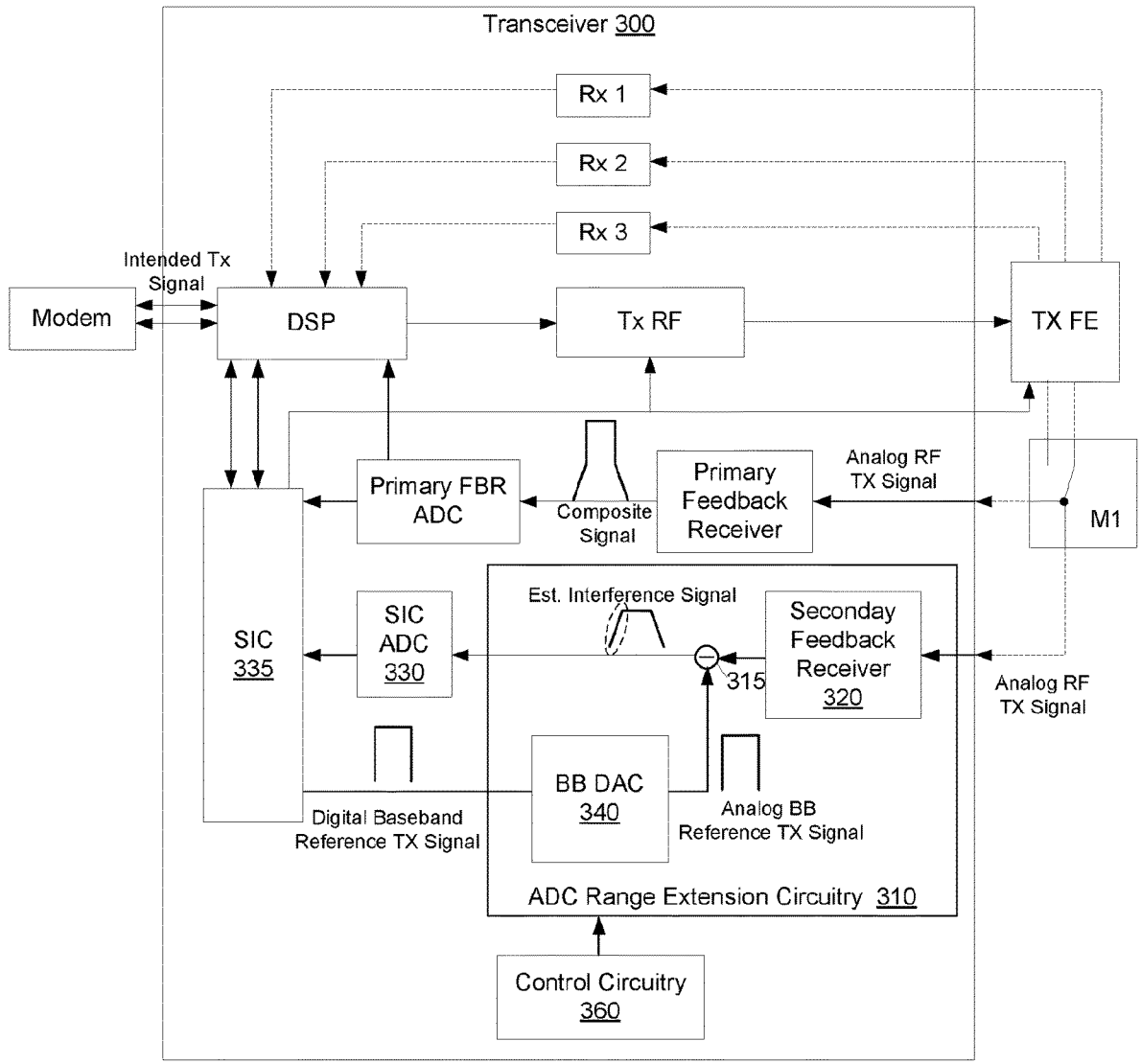
FIG. 3 illustrates an exemplary transceiver that includes an example range extension circuitry in accordance with various aspects described.

FIG. 3 illustrates an exemplary transceiver 300 that includes one example ADC range extension circuitry 310. The transceiver 300 includes many of the same components described with reference to FIG. 1 which will not be reintroduced for brevity sake, including a modem, DSP circuitry, transmit RF circuitry, front end, and receiver chains. Control circuitry 360 is configured to selectively activate/enable and deactivate/disable the ADC range extension circuitry 310 as just discussed. The transceiver 300 includes a multiplexer M1 which selects a point in the front end from which the RF transmit signal is fed back.

The ADC range extension circuitry 310 includes a separate secondary feedback receiver 320 that downconverts the RF transmit signal to the baseband frequency to generate the composite signal. The ADC range extension circuitry 310 includes a baseband DAC 340 that converts the digital baseband reference transmit signal from SIC circuitry to an analog baseband reference transmit signal. Subtraction circuitry 315 computes a difference between the composite signal and the analog baseband reference transmit signal to generate the estimated interference signal. The estimated interference signal is provided to a SIC ADC 330, which generates a digital estimated interference signal for use by SIC circuitry 335 in noise or interference cancellation.

Figure 4:
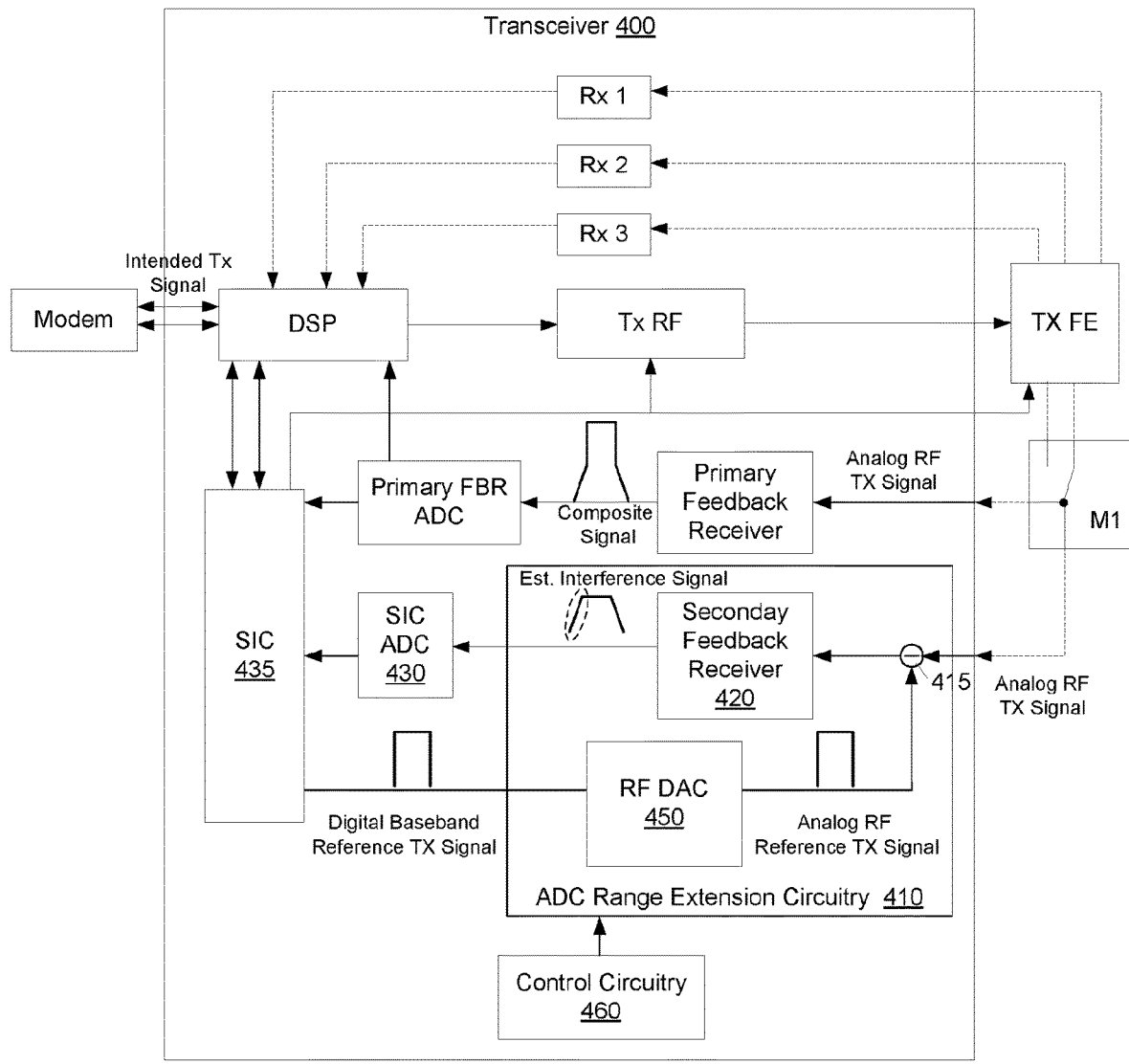
FIG. 4 illustrates an exemplary transceiver that includes an example range extension circuitry in accordance with various aspects described.

FIG. 4 illustrates a transceiver 400 that includes one example ADC range extension circuitry 410. The transceiver 400 includes many of the same components described with reference to FIG. 1 which will not be reintroduced for brevity sake, including a modem, DSP circuitry, transmit RF circuitry, front end, and receiver chains. Control circuitry 460 is configured to selectively activate/enable and deactivate/disable the ADC range extension circuitry 410 as just discussed. The transceiver 400 includes a multiplexer M1 which selects a point in the front end from which the RF transmit signal is fed back.

The ADC range extension circuitry 410 includes an RF DAC 450 that converts the digital baseband reference transmit signal received from SIC circuitry 435 to an analog RF reference transmit signal. The analog RF reference transmit signal is subtracted from the RF transmit signal by subtraction circuitry 415 and a secondary feedback receiver 420 downconverts the resulting difference (e.g., estimated RF interference signal) to a baseband estimated interference signal. The baseband estimated interference signal is provided to a SIC ADC 430, which generates a digital estimated interference signal for use by the SIC circuitry 435 in noise or interference cancellation.

Figure 5:
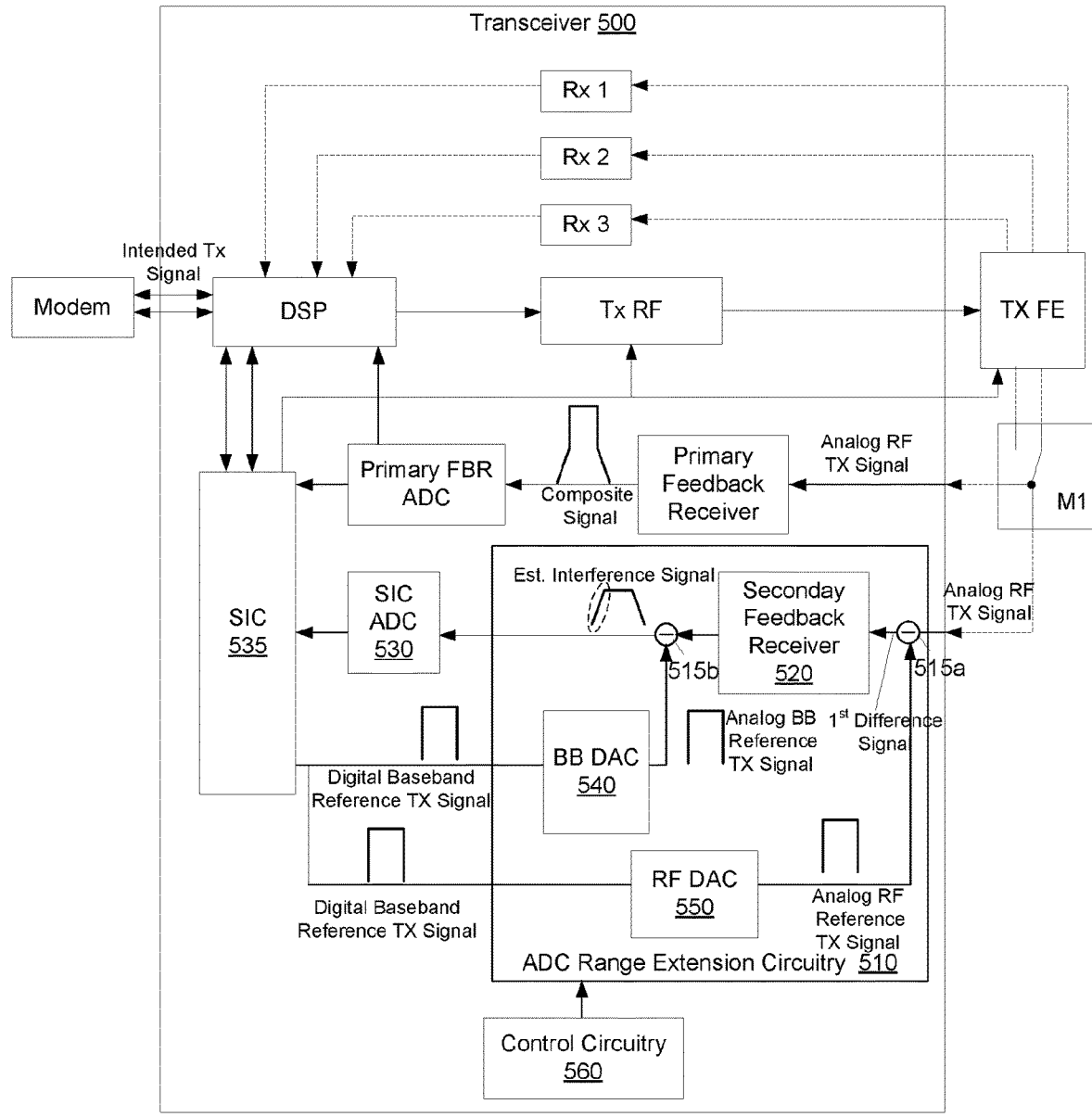
FIG. 5 illustrates an exemplary transceiver that includes an example range extension circuitry in accordance with various aspects described.

FIG. 5 illustrates a transceiver 500 that includes one example ADC range extension circuitry 510. The transceiver 500 includes many of the same components described with reference to FIG. 1 which will not be reintroduced for brevity sake, including a modem, DSP circuitry, transmit RF circuitry, front end, and receiver chains. Control circuitry 560 is configured to selectively activate/enable and deactivate/disable the ADC range extension circuitry 510 as just discussed. The transceiver 500 includes a multiplexer M1 which selects a point in the front end from which the RF transmit signal is fed back.

The ADC range extension circuitry 510 includes an RF DAC 550 that converts the digital baseband reference transmit signal received from SIC circuitry 535 to an analog RF reference transmit signal. The analog RF reference transmit signal is subtracted from the RF transmit signal by a first subtraction circuitry 515a and a secondary feedback receiver 520 downconverts the resulting difference (e.g., RF estimated interference signal) to a first difference signal. The ADC range extension circuitry 510 also includes a baseband DAC 540 that converts the digital baseband reference transmit signal from the SIC circuitry 535 to an analog baseband reference transmit signal. A second subtraction circuitry 515b computes a difference between the first difference signal generated by the secondary feedback receiver 520 and the analog baseband reference transmit signal to generate the estimated interference signal that is provided to a SIC ADC 530. The SIC ADC 535 generates a digital estimated interference signal for use by the SIC circuitry 535 in noise or interference cancellation. In this manner, in the example transceiver 500 the RF estimated interference signal is further refined by subtracting the reference transmit signal a second time in the baseband frequency.

While the examples of FIGS. 3-5 illustrate a separate secondary feedback receiver in the ADC range extension circuitry, it is to be understood that further examples of the ADC range extension circuitry receive the composite signal from the primary feedback receiver as illustrated in FIG. 2. In those examples, the ADC range extension circuitry may not include a secondary feedback receiver.

Figure 6:
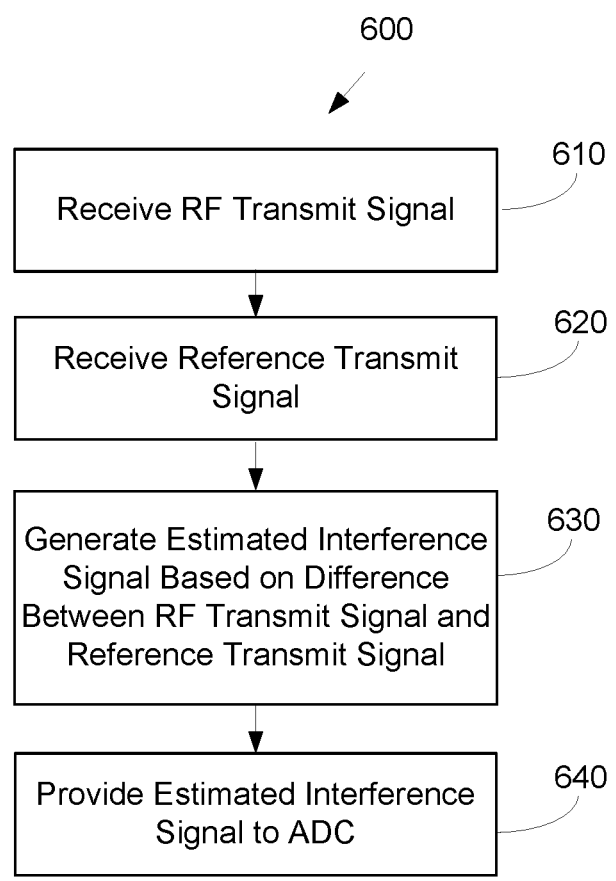
FIG. 6 illustrates an exemplary flow diagram of an example method of generating an estimated interference signal in a manner that improves the dynamic range of an analog-to-digital converter (ADC) in accordance with various aspects described.

FIG. 6 illustrates a flow diagram outlining an example method 600 for generating an estimated interference signal for use by SIC circuitry. The method includes, at 610, receiving an RF transmit signal from front end circuitry. At 620 a digital baseband reference transmit signal is received from the SIC circuitry. Recall that the digital baseband reference signal corresponds to or describes the intended transmit signal. The digital baseband reference signal may be received from the DSP circuitry. The method includes, at 630, approximating the interference signal by generating an analog estimated interference signal based on a difference between the RF transmit signal and the digital baseband reference transmit signal. At 640, the analog estimated interference signal is provided to an ADC to generate a digital estimated interference signal. The digital estimated interference signal is provided to the SIC circuitry. The SIC circuitry controls the DSP, the transmit RF circuitry, and the front end circuitry based on the digital baseband reference transmit signal, which corresponds to the intended transmit signal, and the digital estimated interference signal.

Figure 7A:
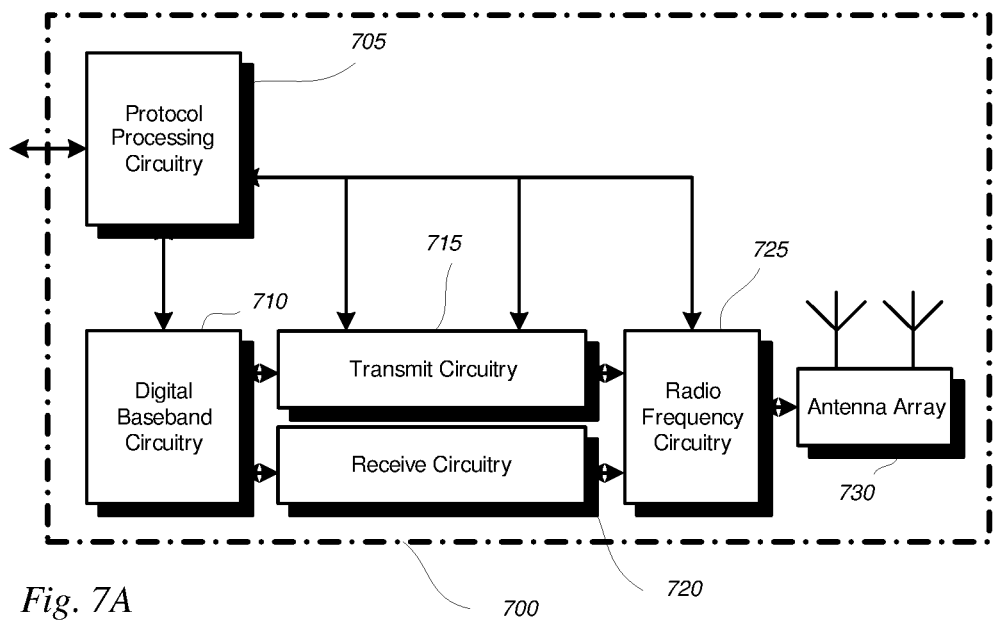
FIGS. 7A-7C illustrate examples for an exemplary communication circuitry in accordance with various aspects described.

FIG. 7A illustrates an exemplary millimeter wave communication circuitry 700 which may embody the transceivers of FIGS. 1-5 according to some aspects. Circuitry 700 is alternatively grouped according to functions. Components as shown in 700 are shown here for illustrative purposes and may include other components not shown here in FIG. 7A.

Millimeter wave communication circuitry 700 may include protocol processing circuitry 705, which may implement one or more of medium access control (MAC), radio link control (RLC), packet data convergence protocol (PDCP), radio resource control (RRC) and non-access stratum (NAS) functions. Protocol processing circuitry 705 may include one or more processing cores (not shown) to execute instructions and one or more memory structures (not shown) to store program and data information.

Millimeter wave communication circuitry 700 may further include digital baseband circuitry 710, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 700 may further include transmit circuitry 715, receive circuitry 720 and/or antenna array circuitry 730.

Millimeter wave communication circuitry 700 may further include radio frequency (RF) circuitry 725. In an aspect of the disclosure, RF circuitry 725 may include multiple parallel RF chains for one or more of transmit or receive functions, each connected to one or more antennas of the antenna array 730.

In an aspect of the disclosure, protocol processing circuitry 705 may include one or more instances of control circuitry (not shown) to provide control functions for one or more of digital baseband circuitry 710, transmit circuitry 715, receive circuitry 720, and/or radio frequency circuitry 725.

Figure 7B:
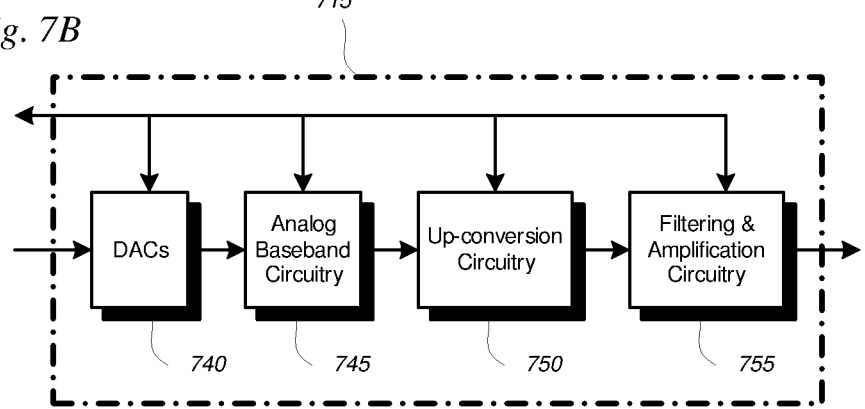
Figure 7C:
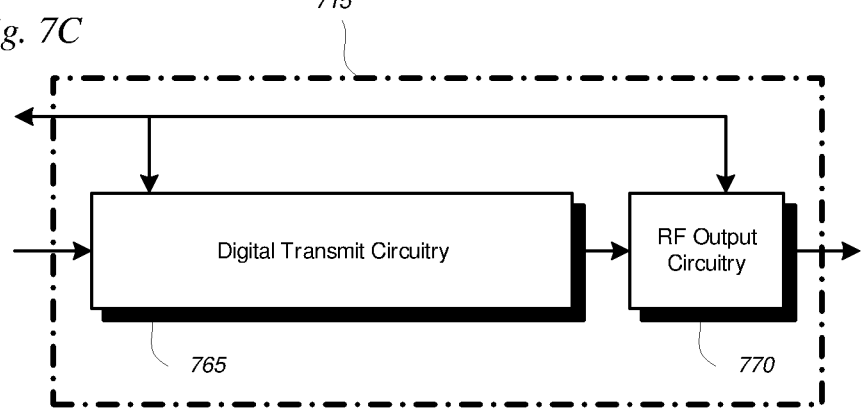

FIGS. 7B and 7C illustrate examples for transmit circuitry 715 in FIG. 7A in some aspects.

The exemplary transmit circuitry 715 of FIG. 7B may include one or more of digital to analog converters (DACs) 740, analog baseband circuitry 745, up-conversion circuitry 750 and filtering and amplification circuitry 755. In another aspect, 7C illustrates an exemplary transmit circuitry 715 which includes digital transmit circuitry 765 and output circuitry 770.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

Examples can include subject matter such as a method, means for performing acts or blocks of the method, at least one machine-readable medium including instructions that, when performed by a machine cause the machine to perform acts of the method or of an apparatus or system for extending the range of an ADC according to aspects and examples described herein.

Example 1 is a transceiver, including front end circuitry, self-interference cancellation circuitry, and analog-to-digital converter range extension circuitry. The front end circuitry is configured to generate a radio frequency (RF) transmit signal comprising a predetermined signal and an interference signal. The self-interference cancellation (SIC) circuitry is configured to a receive a digital baseband reference transmit signal that comprises a digital representation of the predetermined signal and control the front end circuitry based at least on the digital baseband reference transmit signal and a digital estimated interference signal. The analog-to-digital converter (ADC) range extension circuitry is configured to: generate an analog estimated interference signal based on a difference between the RF transmit signal and the digital baseband reference transmit signal; and provide the analog estimated interference signal to an ADC to generate the digital estimated interference signal. The SIC circuitry is configured to approximate the interference signal based on the digital estimated interference signal.

Example 2 includes the subject matter of example 1, including or omitting any option elements, wherein the ADC range extension circuitry further includes: baseband digital-to-analog converter (DAC) configured to convert the digital baseband reference transmit signal to an analog baseband reference transmit signal; subtraction circuitry configured to: receive an analog baseband transmit signal from a feedback receiver that downconverts the RF transmit signal to a baseband frequency; receive the analog baseband reference transmit signal from the baseband DAC; and determine a difference between the analog baseband transmit signal and the analog baseband reference transmit signal as the analog estimated interference signal.

Example 3 includes the subject matter of example 1, including or omitting any option elements, wherein the ADC range extension circuitry further includes: a feedback receiver configured to downconvert the RF transmit signal to a baseband frequency to generate an analog baseband transmit signal; baseband digital-to-analog converter (DAC) configured to convert the digital baseband reference transmit signal to an analog baseband reference transmit signal; subtraction circuitry configured to: receive the analog baseband transmit signal from the feedback receiver; receive the analog baseband reference transmit signal from the baseband DAC; and determine a difference between the analog baseband transmit signal and the analog baseband reference transmit signal as the analog estimated interference signal.

Example 4 includes the subject matter of example 1, including or omitting any option elements, wherein the ADC range extension circuitry further includes: an RF digital-to-analog converter (DAC) configured to convert the digital baseband reference transmit signal to an analog RF reference transmit signal; first subtraction circuitry configured to: receive the RF transmit signal from the front end circuitry; receive the analog RF reference transmit signal from the RF DAC; determine a difference between the analog RF transmit signal and the analog RF reference transmit signal as an analog RF estimated interference signal; and a feedback receiver configured to downconvert the analog RF estimated interference signal to the analog estimated interference signal.

Example 5 includes the subject matter of example 1, including or omitting any option elements, wherein the ADC range extension circuitry further includes: an RF digital-to-analog converter (DAC) configured to convert the digital baseband reference transmit signal to an analog RF reference transmit signal; first subtraction circuitry configured to: receive the RF transmit signal from the front end circuitry; receive the analog RF reference transmit signal from the RF DAC; determine a difference between the analog RF transmit signal and the analog RF reference transmit signal as a first difference signal; and a feedback receiver configured to downconvert the first difference signal to a baseband first difference signal; baseband digital-to-analog converter (DAC) configured to convert the digital baseband reference transmit signal to an analog baseband reference transmit signal; second subtraction circuitry configured to: receive the baseband first difference signal; receive the analog baseband reference transmit signal from the baseband DAC; and determine a difference between the baseband first difference signal and the analog baseband reference transmit signal as the analog estimated interference signal.

Example 6 includes the subject matter of examples 1-5, including or omitting any option elements, further including control circuitry configured to: determine that an activation criterion is met; in response, activate the ADC range extension circuitry such that the ADC range extension circuitry provides the analog estimated interference signal to the ADC; determine that the activation criterion is not met; and in response, de-activate the ADC range extension circuitry such that the ADC range extension circuitry does not provide the analog estimated interference signal to the ADC.

Example 7 includes the subject matter of example 6, including or omitting any option elements, wherein the activation criterion includes a predetermined combination of received signal frequencies of signals being received by the transceiver and a frequency of the RF transmit signal.

Example 8 is a method, including: receiving an RF transmit signal from front end circuitry in a transceiver; receiving a digital baseband reference transmit signal corresponding to a predetermined signal; generating an analog estimated interference signal based on a difference between the RF transmit signal and the digital baseband reference transmit signal; and providing the analog estimated interference signal to an ADC to generate a digital estimated interference signal. The digital estimated interference signal is input to interference cancellation circuitry.

Example 9 includes the subject matter of example 8, including or omitting any option elements, including: converting the digital baseband reference transmit signal to an analog baseband reference transmit signal; receiving an analog baseband transmit signal from a feedback receiver that downconverts the RF transmit signal to a baseband frequency; and determining a difference between the analog baseband transmit signal and the analog baseband reference transmit signal as the analog estimated interference signal.

Example 10 includes the subject matter of example 8, including or omitting any option elements, further including: downconverting the RF transmit signal to a baseband frequency to generate an analog baseband transmit signal; converting the digital baseband reference transmit signal to an analog baseband reference transmit signal; and determining a difference between the analog baseband transmit signal and the analog baseband reference transmit signal as the analog estimated interference signal.

Example 11 includes the subject matter of example 8, including or omitting any option elements, further including: converting the digital baseband reference transmit signal to an analog RF reference transmit signal; determine a difference between the analog RF transmit signal and the analog RF reference transmit signal as an analog RF estimated interference signal; and downconverting the analog RF estimated interference signal to the analog estimated interference signal.

Example 12 includes the subject matter of example 8, including or omitting any option elements, further including: converting the digital baseband reference transmit signal to an analog RF reference transmit signal; determine a difference between the analog RF transmit signal and the analog RF reference transmit signal as a first difference signal; downconverting the first difference signal to a baseband first difference signal; converting the digital baseband reference transmit signal to an analog baseband reference transmit signal; and determining a difference between the baseband first difference signal and the analog baseband reference transmit signal as the analog estimated interference signal.

Example 13 includes the subject matter of examples 8-12, including or omitting any option elements, further including: determining that an activation criterion is met; in response, providing the analog estimated interference signal to the ADC; determining that the activation criterion is not met; and in response, refraining from providing the analog estimated interference signal to the ADC.

Example 14 includes the subject matter of example 13, including or omitting any option elements, wherein the activation criterion includes a predetermined combination of received signal frequencies of signals being received by the transceiver and a frequency of the RF transmit signal.

Example 15 includes the subject matter of example 13, including or omitting any option elements, wherein the activation criterion includes an operating mode of the transceiver.

Example 16 is an analog-to-digital converter (ADC) range extension circuitry, configured to: receive an RF transmit signal from front end circuitry of a transceiver; receive a digital baseband reference transmit signal from SIC circuitry in the transceiver; and approximate an interference signal in the RF transmit signal by generating an analog estimated interference signal that corresponds to a difference between the RF transmit signal and the digital baseband reference transmit signal; and provide the analog estimated interference signal to an ADC, wherein a digital estimated interference signal output by the ADC is input to the SIC circuitry.

Example 17 includes the subject matter of example 16, including or omitting any option elements, further including: baseband digital-to-analog converter (DAC) configured to convert the digital baseband reference transmit signal to an analog baseband reference transmit signal; subtraction circuitry configured to: receive an analog baseband transmit signal from a feedback receiver that downconverts the RF transmit signal to a baseband frequency; receive the analog baseband reference transmit signal from the baseband DAC; and determine a difference between the analog baseband transmit signal and the analog baseband reference transmit signal as the analog estimated interference signal.

Example 18 includes the subject matter of example 16, including or omitting any option elements, further including: a feedback receiver configured to downconvert the RF transmit signal to a baseband frequency to generate an analog baseband transmit signal; baseband digital-to-analog converter (DAC) configured to convert the digital baseband reference transmit signal to an analog baseband reference transmit signal; subtraction circuitry configured to: receive the analog baseband transmit signal from the feedback receiver; receive the analog baseband reference transmit signal from the baseband DAC; and determine a difference between the analog baseband transmit signal and the analog baseband reference transmit signal as the analog estimated interference signal.

Example 19 includes the subject matter of example 16, including or omitting any option elements, further including: an RF digital-to-analog converter (DAC) configured to convert the digital baseband reference transmit signal to an analog RF reference transmit signal; first subtraction circuitry configured to: receive the RF transmit signal from the front end circuitry; receive the analog RF reference transmit signal from the RF DAC; determine a difference between the analog RF transmit signal and the analog RF reference transmit signal as an analog RF estimated interference signal; and a feedback receiver configured to downconvert the analog RF estimated interference signal to the analog estimated interference signal.

Example 20 includes the subject matter of example 16, including or omitting any option elements, further including: an RF digital-to-analog converter (DAC) configured to convert the digital baseband reference transmit signal to an analog RF reference transmit signal; first subtraction circuitry configured to: receive the RF transmit signal from the front end circuitry; receive the analog RF reference transmit signal from the RF DAC; determine a difference between the analog RF transmit signal and the analog RF reference transmit signal as a first difference signal; and a feedback receiver configured to downconvert the first difference signal to a baseband first difference signal; baseband digital-to-analog converter (DAC) configured to convert the digital baseband reference transmit signal to an analog baseband reference transmit signal; second subtraction circuitry configured to: receive the baseband first difference signal; receive the analog baseband reference transmit signal from the baseband DAC; and determine a difference between the baseband first difference signal and the analog baseband reference transmit signal as the analog estimated interference signal.

Example 21 includes the subject matter of examples 16-20, including or omitting any option elements, further configured to provide the analog estimated interference signal to the ADC in response to receiving an activation signal.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated aspects of the subject disclosure, including what is described in the Abstract, is not intended to be exhaustive or to limit the disclosed aspects to the precise forms disclosed. While specific aspects and examples are described herein for illustrative purposes, various modifications are possible that are considered within the scope of such aspects and examples, as those skilled in the relevant art can recognize.

In this regard, while the disclosed subject matter has been described in connection with various aspects and corresponding Figures, where applicable, it is to be understood that other similar aspects can be used or modifications and additions can be made to the described aspects for performing the same, similar, alternative, or substitute function of the disclosed subject matter without deviating therefrom. Therefore, the disclosed subject matter should not be limited to any single aspect described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A transceiver, comprising:
   front end circuitry configured to generate a radio frequency (RF) transmit signal comprising a predetermined signal and an interference signal;
   self-interference cancellation (SIC) circuitry configured to a receive a digital baseband reference transmit signal that comprises a digital representation of the predetermined signal and control the front end circuitry based at least on the digital baseband reference transmit signal and a digital estimated interference signal; and
   analog-to-digital converter (ADC) range extension circuitry configured to:
   generate an analog estimated interference signal based on a difference between the RF transmit signal and the digital baseband reference transmit signal; and
   provide the analog estimated interference signal to an ADC to generate the digital estimated interference signal;

wherein the SIC circuitry is configured to approximate the interference signal based on the digital estimated interference signal.

2. The transceiver of claim 1, wherein the ADC range extension circuitry further comprises:
a baseband digital-to-analog converter (DAC) configured to convert the digital baseband reference transmit signal to an analog baseband reference transmit signal; and
subtraction circuitry configured to:
receive an analog baseband transmit signal from a feedback receiver that downconverts the RF transmit signal to a baseband frequency;
receive the analog baseband reference transmit signal from the baseband DAC; and
determine a difference between the analog baseband transmit signal and the analog baseband reference transmit signal as the analog estimated interference signal.

3. The transceiver of claim 1, wherein the ADC range extension circuitry further comprises:
a feedback receiver configured to downconvert the RF transmit signal to a baseband frequency to generate an analog baseband transmit signal;
a baseband digital-to-analog converter (DAC) configured to convert the digital baseband reference transmit signal to an analog baseband reference transmit signal; and
subtraction circuitry configured to:
receive the analog baseband transmit signal from the feedback receiver;
receive the analog baseband reference transmit signal from the baseband DAC; and
determine a difference between the analog baseband transmit signal and the analog baseband reference transmit signal as the analog estimated interference signal.

4. The transceiver of claim 1, wherein the ADC range extension circuitry further comprises:
an RF digital-to-analog converter (DAC) configured to convert the digital baseband reference transmit signal to an analog RF reference transmit signal;
first subtraction circuitry configured to:
receive the RF transmit signal from the front end circuitry;
receive the analog RF reference transmit signal from the RF DAC;
determine a difference between the analog RF transmit signal and the analog RF reference transmit signal as an analog RF estimated interference signal; and
a feedback receiver configured to downconvert the analog RF estimated interference signal to the analog estimated interference signal.

5. The transceiver of claim 1, wherein the ADC range extension circuitry further comprises:
an RF digital-to-analog converter (DAC) configured to convert the digital baseband reference transmit signal to an analog RF reference transmit signal;
first subtraction circuitry configured to:
receive the RF transmit signal from the front end circuitry;
receive the analog RF reference transmit signal from the RF DAC; and
determine a difference between the analog RF transmit signal and the analog RF reference transmit signal as a first difference signal;
a feedback receiver configured to downconvert the first difference signal to a baseband first difference signal;
a baseband digital-to-analog converter (DAC) configured to convert the digital baseband reference transmit signal to an analog baseband reference transmit signal; and
second subtraction circuitry configured to:
receive the baseband first difference signal;
receive the analog baseband reference transmit signal from the baseband DAC; and
determine a difference between the baseband first difference signal and the analog baseband reference transmit signal as the analog estimated interference signal.

6. The transceiver of claim 1, further comprising control circuitry configured to:
determine that an activation criterion is met, and in response to the activation criterion being met, activate the ADC range extension circuitry such that the ADC range extension circuitry provides the analog estimated interference signal to the ADC; and/or
determine that the activation criterion is not met, and in response to the activation criterion not being met, de-activate the ADC range extension circuitry such that the ADC range extension circuitry does not provide the analog estimated interference signal to the ADC.

7. The transceiver of claim 6, wherein the activation criterion comprises a predetermined combination of received signal frequencies of signals being received by the transceiver and a frequency of the RF transmit signal.

8. A method, comprising:
receiving a radio frequency (RF) transmit signal from front end circuitry in a transceiver;
receiving a digital baseband reference transmit signal corresponding to a predetermined signal;
generating an analog estimated interference signal based on a difference between the RF transmit signal and the digital baseband reference transmit signal; and
providing the analog estimated interference signal to an analog-to-digital converter (ADC) to generate a digital estimated interference signal,
wherein the digital estimated interference signal is input to interference cancellation circuitry,
determining that an activation criterion is met, and in response to the activation criterion being met, providing the analog estimated interference signal to the ADC; and/or
determining that the activation criterion is not met, and in response to the activation criterion not being met, refraining from providing the analog estimated interference signal to the ADC.

9. The method of claim 8, comprising:
converting the digital baseband reference transmit signal to an analog baseband reference transmit signal;
receiving an analog baseband transmit signal from a feedback receiver that downconverts the RF transmit signal to a baseband frequency; and
determining a difference between the analog baseband transmit signal and the analog baseband reference transmit signal as the analog estimated interference signal.

10. The method of claim 8, further comprising:
downconverting the RF transmit signal to a baseband frequency to generate an analog baseband transmit signal;
converting the digital baseband reference transmit signal to an analog baseband reference transmit signal; and determining a difference between the analog baseband transmit signal and the analog baseband reference transmit signal as the analog estimated interference signal.

11. The method of claim 8, further comprising:
converting the digital baseband reference transmit signal to an analog RF reference transmit signal;
determine a difference between the analog RF transmit signal and the analog RF reference transmit signal as an analog RF estimated interference signal; and
downconverting the analog RF estimated interference signal to the analog estimated interference signal.

12. The method of claim 8, further comprising:
converting the digital baseband reference transmit signal to an analog RF reference transmit signal;
determine a difference between the analog RF transmit signal and the analog RF reference transmit signal as a first difference signal;
downconverting the first difference signal to a baseband first difference signal;
converting the digital baseband reference transmit signal to an analog baseband reference transmit signal; and
determining a difference between the baseband first difference signal and the analog baseband reference transmit signal as the analog estimated interference signal.

13. The method of claim 8, wherein the activation criterion comprises a predetermined combination of received signal frequencies of signals being received by the transceiver and a frequency of the RF transmit signal.

14. The method of claim 8, wherein the activation criterion comprises an operating mode of the transceiver.

15. Analog-to-digital converter (ADC) range extension circuitry, configured to:
receive a radio frequency (RF) transmit signal from front end circuitry of a transceiver;
receive a digital baseband reference transmit signal from self-interference cancellation (SIC) circuitry in the transceiver;
approximate an interference signal in the RF transmit signal by generating an analog estimated interference signal that corresponds to a difference between the RF transmit signal and the digital baseband reference transmit signal; and
provide the analog estimated interference signal to an analog-to-digital converter (ADC), wherein a digital estimated interference signal output by the ADC is input to the SIC circuitry
the ADC range extension circuitry further comprising:
an RF digital-to-analog converter (DAC) configured to convert the digital baseband reference transmit signal to an analog RF reference transmit signal;
first subtraction circuitry configured to:
receive the RF transmit signal from the front end circuitry;
receive the analog RF reference transmit signal from the RF DAC; and
determine a difference between the analog RF transmit signal and the analog RF reference transmit signal as a first difference signal;
a feedback receiver configured to downconvert the first difference signal to a baseband first difference signal;
a baseband digital-to-analog converter (DAC) configured to convert the digital baseband reference transmit signal to an analog baseband reference transmit signal; and
second subtraction circuitry configured to:
receive the baseband first difference signal;
receive the analog baseband reference transmit signal from the baseband DAC; and
determine a difference between the baseband first difference signal and the analog baseband reference transmit signal as the analog estimated interference signal.

\* \* \* \* \*